US010840445B2

(12) United States Patent
Yamamoto et al.

(10) Patent No.: US 10,840,445 B2
(45) Date of Patent: Nov. 17, 2020

(54) MEMORY DEVICE

(71) Applicant: TOSHIBA MEMORY CORPORATION, Tokyo (JP)

(72) Inventors: Kazuhiko Yamamoto, Yokkaichi (JP); Kunifumi Suzuki, Yokkaichi (JP); Tomotaka Ariga, Yokkaichi (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 211 days.

(21) Appl. No.: 15/916,805

(22) Filed: Mar. 9, 2018

(65) Prior Publication Data

US 2019/0074438 A1 Mar. 7, 2019

(30) Foreign Application Priority Data

Sep. 1, 2017 (JP) ................................. 2017-168176

(51) Int. Cl.
H01L 45/00 (2006.01)

(52) U.S. Cl.
CPC ............ *H01L 45/146* (2013.01); *H01L 45/08* (2013.01); *H01L 45/1608* (2013.01); *H01L 45/1641* (2013.01)

(58) Field of Classification Search
CPC .... H01L 45/146; H01L 45/08; H01L 45/1608
See application file for complete search history.

(56) References Cited

U.S. PATENT DOCUMENTS

| 9,159,769 | B2 | 10/2015 | Suguro | |
| 2010/0258782 | A1* | 10/2010 | Kuse | H01L 45/146 257/4 |
| 2013/0193396 | A1 | 8/2013 | Nakano et al. | |
| 2016/0049584 | A1* | 2/2016 | Dang | H01L 45/08 257/4 |
| 2017/0040380 | A1 | 2/2017 | Yamaguchi et al. | |
| 2017/0316822 | A1 | 11/2017 | Sei et al. | |

FOREIGN PATENT DOCUMENTS

| JP | 2017-037872 A | 2/2017 |
| WO | WO-2016/052097 A1 | 4/2016 |

OTHER PUBLICATIONS

Y. Yoshimoto, et al., "A ReRAM-based Physically Unclonable Function with Bit Error Rate <0.5% after 10 years at 125° C. for 40nm embedded application", VLSI2016_T08-04, 2016 Symposium on VLSI Technology Digest of Technical Papers, pp. 198-199.
S. Ambrogio, et al., "Novel RRAM-enabled 1T1R synapse capable of low-power STDP via burst-mode communication and real-time unsupervised machine learning", VLSI2016_T08-03, 2016 Symposium on VLSI Technology Digest of Technical Papers, pp. 196-197.

(Continued)

*Primary Examiner* — Errol V Fernandes
(74) *Attorney, Agent, or Firm* — Foley & Lardner LLP

(57) ABSTRACT

A memory device includes a crystal-including layer including a first metal, and a germanium-and-oxygen including layer contacting the crystal-including layer. At least a portion of the crystal-including layer is crystallized. The germanium-and-oxygen including layer includes germanium and oxygen.

12 Claims, 7 Drawing Sheets

(56) References Cited

OTHER PUBLICATIONS

B. Govoreanu, et al., "a-VMCO: a novel forming-free, self-rectifying, analog memory cell with low-current operation, nonfilamentary switching and excellent variability", VLSI2015_T9-3, 2015 Symposium on VLSI Technology Digest of Technical Papers, pp. T132-T133.
Won Ho Choi, et al., "An 8-bit Analog-to-Digital Converter based on the Voltage-Dependent Switching Probability of a Magnetic Tunnel Junction", VLSI2016_T12-3, 2015 Symposium on VLSI Technology Digest of Technical Papers, pp. T162-T163.
Min-Che Hsieh, et al., "Ultra High Density 3D Via RRAM in Pure 28nm CMOS Process", IEDM2013-S10P04, 2013, pp. 10.3.1-10.3.4.

\* cited by examiner

| | | FILM THICKNESS (nm) | | | | | |
|---|---|---|---|---|---|---|---|
| | | 0.5 | 1.0 | 1.5 | 2.0 | 3.0 | 4.0 |
| SIMPLE GERMANIUM | NO OXYGEN | × DIELECTRIC BREAKDOWN | × DIELECTRIC BREAKDOWN | × DIELECTRIC BREAKDOWN | × DIELECTRIC BREAKDOWN | × DIELECTRIC BREAKDOWN | × DIELECTRIC BREAKDOWN |
| GERMANIUM OXIDE | LOW ↓ OXYGEN COMPOSITION ↓ HIGH | △ LOW RESISTANCE CHANGE RATIO | △ LOW RESISTANCE CHANGE RATIO | △ LOW RESISTANCE CHANGE RATIO | △ LOW RESISTANCE CHANGE RATIO | △ LOW RESISTANCE CHANGE RATIO | ○ HIGH OPERATING VOLTAGE |
| | | △ LOW RESISTANCE CHANGE RATIO | △ LOW RESISTANCE CHANGE RATIO | △ LOW RESISTANCE CHANGE RATIO | ◎ | ○ HIGH OPERATING VOLTAGE | ○ HIGH OPERATING VOLTAGE |
| | | △ LOW RESISTANCE CHANGE RATIO | ◎ | ◎ | ◎ | ○ HIGH OPERATING VOLTAGE | ○ HIGH OPERATING VOLTAGE |
| | | ◎ | ◎ | ◎ | ◎ | ○ HIGH OPERATING VOLTAGE | ○ HIGH OPERATING VOLTAGE |

FIG. 7

MEMORY DEVICE

CROSS-REFERENCE TO RELATED APPLICATIONS

This application is based upon and claims the benefit of priority from Japanese Patent Application No. 2017-168176, filed on Sep. 1, 2017; the entire contents of which are incorporated herein by reference.

FIELD

Embodiments relate to a memory device.

BACKGROUND

In recent years, there is a resistance random access memory device in which the resistance is changed by the distribution of oxygen in a metal oxide layer. It is problematic that the characteristics are deteriorated due to the repeatable distribution change of oxygen distribution in such a memory device.

BRIEF DESCRIPTION OF THE DRAWINGS

FIG. 7 is a table showing an effects of a film thickness and an oxygen concentration of a germanium-and-oxygen including layer on the characteristics of the samples, in which the film thickness of the germanium-and-oxygen including layer is shown in the column direction, and the oxygen concentration is shown in the row direction.

DETAILED DESCRIPTION

A memory device according to an embodiment includes a crystal-including layer including a first metal, and a germanium-and-oxygen including layer contacting the crystal-including layer. At least a portion of the crystal-including layer is crystallized. The germanium-and-oxygen including layer includes germanium and oxygen.

First Embodiment

A first embodiment will now be described.

Figure 1:
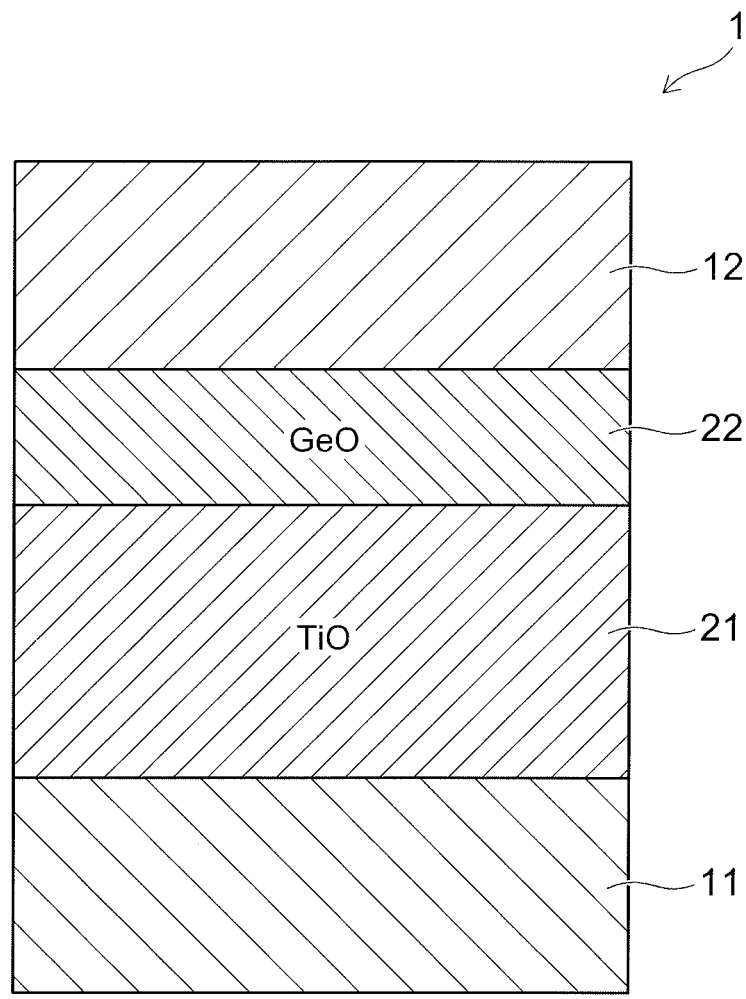
FIG. 1 is a cross-sectional view showing a memory device according to a first embodiment.

FIG. 1 is a cross-sectional view showing a memory device according to the embodiment.

Although typical compositions of several layers are shown in the drawing to help intuitive understanding in FIG. 1, the compositions of these layers are not limited thereto. This is similar for the other drawings described below as well.

As shown in FIG. 1, an electrode 11 and an electrode 12 are provided in the memory device 1 according to the embodiment. For example, the electrode 11 and the electrode 12 are formed of titanium nitride (TiN). For example, the electrode 11 and the electrode 12 may be interconnects extending in mutually-orthogonal directions.

A crystal-including layer 21 is provided on the electrode 11. At least a portion of the crystal-including layer 21 is crystallized. In other words, in the crystal-including layer 21, the entirety may be crystallized; a portion may be crystallized and the remaining portion may be amorphous; or microcrystals and amorphous may coexist. The crystal-including layer 21 includes an oxide, an oxynitride, a silicate, or an aluminate of one or more metals selected from the group consisting of aluminum (Al), titanium (Ti), zirconium (Zr), hafnium (Hf), niobium (Nb), tantalum (Ta), and tungsten (W). The thickness of the crystal-including layer 21 is, for example, 6 to 20 nm (nanometers). In an example, the entire crystal-including layer 21 is made from crystallized titanium oxide (TiO); and the thickness is 6 nm.

A germanium-and-oxygen including layer 22 is provided on the crystal-including layer 21. The germanium-and-oxygen including layer 22 contacts the crystal-including layer 21. The germanium-and-oxygen including layer 22 includes germanium (Ge) and oxygen (O). The thickness of the germanium-and-oxygen including layer 22 is, for example, 1 to 10 nm, e.g., 5 nm or less. In an example, the germanium-and-oxygen including layer 22 is a single layer made of germanium oxide (GeO); and the thickness is 5 nm. For example, the number of oxygen atoms per germanium atom in the germanium-and-oxygen including layer 22 is not less than 1 and not more than 2. In other words, when the composition of the germanium-and-oxygen including layer 22 is represented as $GeO_x$, the average value of x for the entire germanium-and-oxygen including layer 22 is not less than 1 and not more than 2. It is favorable for x to be 2. In other words, it is desirable for the germanium-and-oxygen including layer 22 to include only $GeO_2$. In the case where x is 2, sufficient oxygen can be supplied to the crystal-including layer 21; the crystal structure of the germanium-and-oxygen including layer 22 is stable; and the characteristics are controlled easily. Portions in which x is 1 and portions in which x is 2 may coexist in the germanium-and-oxygen including layer 22. In such a case, the average value of x for the entire germanium-and-oxygen including layer 22 is a value that is greater than 1 and less than 2.

The electrode 12 is disposed on the germanium-and-oxygen including layer 22. In other words, the crystal-including layer 21 and the germanium-and-oxygen including layer 22 are stacked in this order between the electrode 11 and the electrode 12.

A method for forming the germanium-and-oxygen including layer 22 will now be described.

FIGS. 2A to 2D are cross-sectional views showing the method for forming the germanium-and-oxygen including layer of the embodiment.

Figure 2A:
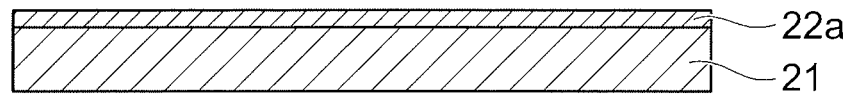
FIGS. 2A to 2D are cross-sectional views showing a method for forming a germanium-and-oxygen including layer of the first embodiment.

First, as shown in FIG. 2A, for example, a germanium layer 22a is formed on the crystal-including layer 21 which is a foundation by depositing germanium by sputtering. At this time, for example, the thickness of the germanium layer 22a is about one atomic layer thick. By stopping the depositing at this thickness, the germanium layer 22a has a layer configuration in which the thickness is uniform.

Figure 2B:
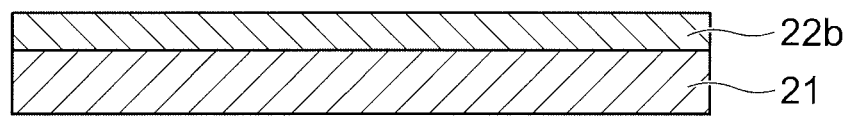

Then, as shown in FIG. 2B, oxidation treatment of the germanium layer 22a is performed. Thereby, the germanium layer 22a is oxidized to become a germanium oxide layer 22b. It is favorable for the oxidation treatment to be performed using as low a temperature as possible to suppress the evaporation of the germanium oxide. For example, the temperature is set to be 200° C. or less and may be, for example, room temperature. To this end, it is favorable to perform radical oxidation by using radical-oxygen excited with plasma, ultraviolet, etc.

Figure 2C:
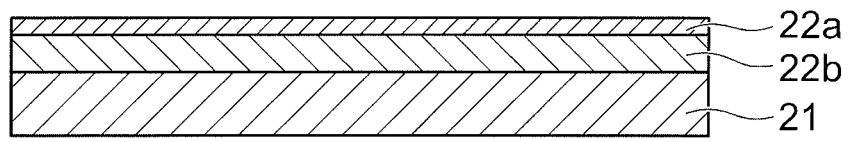

Continuing as shown in FIG. 2C, the germanium layer 22a is formed again on the germanium oxide layer 22b by depositing germanium. For example, the thickness of the germanium layer 22a is about one atomic layer thick.

Figure 2D:
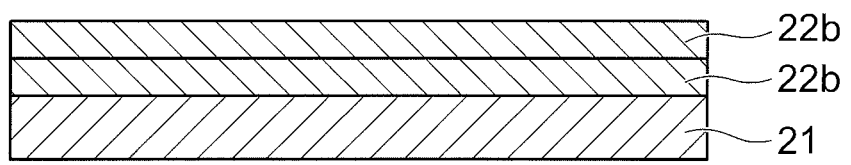

Then, as shown in FIG. 2D, the germanium oxide layer 22b is changed by performing oxidation treatment such as radical oxidation, etc., of the germanium layer 22a. Similarly thereafter, a germanium oxide layer of the desired thickness is formed by repeating the depositing and the oxidization of germanium.

Germanium agglomerates easily compared to silicon; and if the germanium is deposited to be thick, e.g., about 5 nm in the process shown in FIGS. 2A and 2C, the germanium agglomerates and has a particle configuration; and the thickness of the germanium layer 22a becomes nonuniform. If the film thickness is nonuniform, there are cases where an electric field is applied locally to the thin film portions; and dielectric breakdown occurs. To flatten the nonuniform film, for example, it becomes necessary to deposit the germanium layer 22a to be 20 nm or more. Therefore, it is difficult to form a germanium-and-oxygen including layer 22 having a uniform thickness when the thickness is 20 nm or less. This is similar also for the case where germanium oxide is deposited.

Operations of the memory device 1 according to the embodiment will now be described.

As shown in FIG. 1, the resistance value of the memory device 1 becomes high when a positive voltage is applied to the memory device 1 to cause the electrode 11 to become positive and the electrode 12 to become negative. This operation is called "reset." On the other hand, the resistance value of the memory device 1 becomes low when the reverse voltage is applied to cause the electrode 11 to become negative and the electrode 12 to become positive. This operation is called "set." By the reset and the set, the resistance value of the memory device 1 can be switched. Then, data can be stored in the memory device 1 by causing the data to correspond to the resistance value of the memory device 1. Also, the data that is stored in the memory device 1 is read by causing a current to flow between the electrode 11 and the electrode 12 and by measuring the resistance value.

For example, it is estimated that the mechanism of the reset and the set described above is as follows.

Oxygen-deficient sites (not illustrated) exist inside the crystal-including layer 21. Therefore, the crystal-including layer 21 has a constant conductivity. On the other hand, mobile oxygen ions exist inside the germanium-and-oxygen including layer 22. For example, it is considered that the mobile oxygen ions exist at interstitial sites, etc., of the germanium-and-oxygen including layer 22.

When the positive voltage is applied to the memory device 1 in this state, the mobile oxygen ions that are inside the germanium-and-oxygen including layer 22 move into the crystal-including layer 21 due to thermal drift or the effect of the electric field; and the oxygen deficient sites of the crystal-including layer 21 are reduced. As a result, the memory device 1 is reset; and the resistance increases.

Then, when the reverse voltage is applied to the memory device 1, the oxygen ions that are inside the crystal-including layer 21 move into the germanium-and-oxygen including layer 22 due to thermal drift or the effect of the electric field. Thereby, the oxygen deficient sites that are inside the crystal-including layer 21 increase. As a result, the memory device 1 is set; and the resistance decreases.

Effects of the embodiment will now be described.

In the embodiment, the germanium-and-oxygen including layer 22 includes germanium. Because germanium has weaker bonds to oxygen than silicon, more mobile oxygen ions can be supplied. Thereby, the difference between the resistance value when the memory device 1 is in the high resistance state and the resistance value when the memory device 1 is in the low resistance state is increased; and the operation margin can be widened.

Because the germanium-and-oxygen including layer 22 includes oxygen in addition to germanium, more oxygen ions can be supplied to the crystal-including layer 21 when resetting. Thereby, the set and the reset can be performed using a lower voltage. By driving using a low voltage, the durability of the memory device 1 improves. In the specification, the "durability" refers to the stability of the operating characteristics as the set and the reset are repeated; and the durability improves as the number of repetitions for which the prescribed performance can be maintained increases. The operating voltage and the durability of the memory device 1 can be controlled by adjusting the oxygen concentration of the germanium-and-oxygen including layer 22.

Because the germanium-and-oxygen including layer 22 includes germanium and oxygen, the resistance value of the germanium-and-oxygen including layer 22 is not less than a constant. For example, while the bandgap of simple germanium is about 0.7 eV, the bandgap of germanium oxide is about 6.8 eV; therefore, the resistance is high. Thereby, when the voltage is applied between the electrode 11 and the electrode 12, a portion of the electric field is applied to the germanium-and-oxygen including layer 22; and the oxygen ions can be moved reliably. Also, because the electric field applied to the crystal-including layer 21 is relaxed, the damage of the crystal-including layer 21 can be suppressed. Thereby, the durability of the memory device 1 improves.

In the embodiment as shown in FIGS. 2A to 2D, the thin germanium-and-oxygen including layer 22 can be formed uniformly by depositing the thin germanium layer 22a and by performing radical oxidation of the thin germanium layer 22a. By forming the germanium-and-oxygen including layer 22 to be thin, the resistance value of the germanium-and-oxygen including layer 22 is suppressed; and the read current can be increased while reducing the drive voltage of the memory device 1. Also, the defect density inside the germanium-and-oxygen including layer 22 can be reduced. Thereby, the durability of the memory device 1 improves. By using radical oxidation as the oxidization method of the germanium layer 22a, the oxidation treatment can be performed at a low temperature; therefore, the agglomeration of the germanium can be suppressed more effectively.

Second Embodiment

A second embodiment will now be described.

Figure 3:
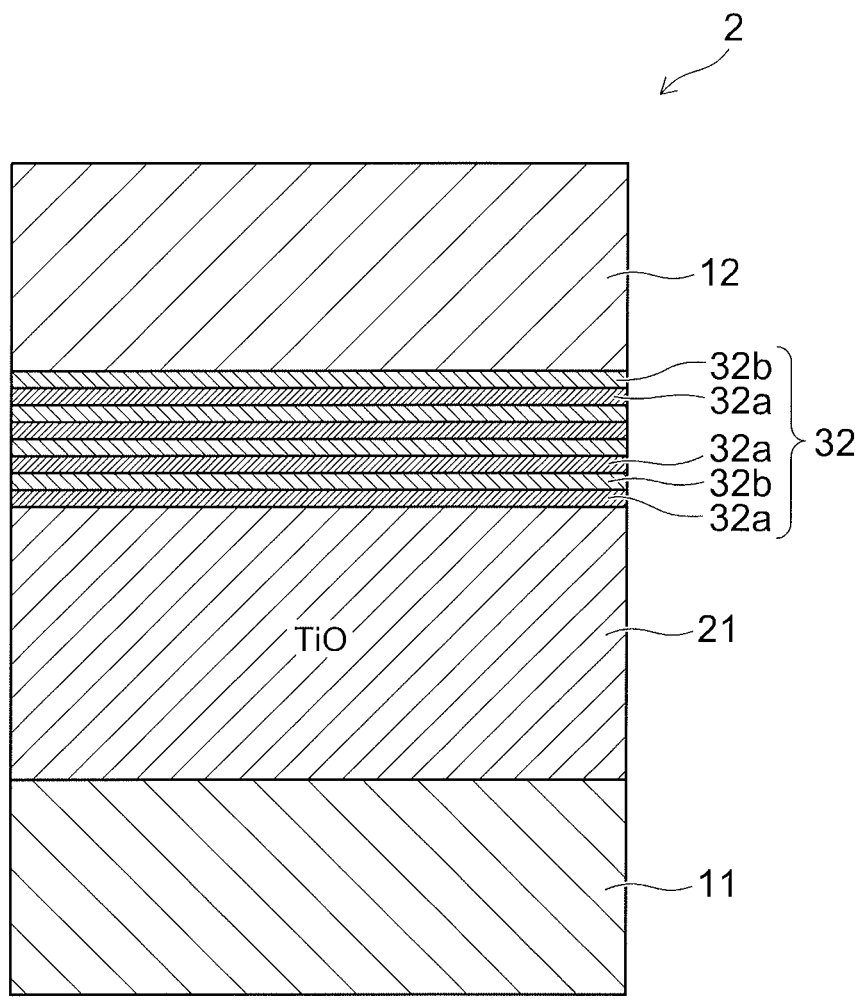
FIG. 3 is a cross-sectional view showing a memory device according to a second embodiment.

FIG. 3 is a cross-sectional view showing a memory device according to the embodiment.

As shown in FIG. 3, the memory device 2 according to the embodiment differs from the memory device 1 according to the first embodiment described above (referring to FIG. 1) in that a germanium-and-oxygen including layer 32 is provided instead of the germanium-and-oxygen including layer 22. A germanium oxide layer 32a that is made of germanium oxide and a germanium layer 32b that is made of simple germanium are stacked alternately in the germanium-and-oxygen including layer 32. However, the crystal-including layer 21 contacts the germanium oxide layer 32a. The thickness of the germanium oxide layer 32a and the thickness of the germanium layer 32b each are, for example, about 1 nm.

According to the embodiment, the germanium-and-oxygen including layer 32 has the stacked structure of the germanium oxide layer 32a and the germanium layer 32b. The read current of the memory device 1 can be increased by reducing the resistance of the entire germanium-and-oxygen including layer 32 by interposing the germanium layer 32b while realizing an operating characteristic and a durability that are similar to those of the first embodiment described above by disposing the germanium oxide layer 32a in contact with the crystal-including layer 21. Also, the operating voltage and the durability can be controlled by adjusting the ratio of the thickness of the germanium oxide layer 32a and the thickness of the germanium layer 32b.

Otherwise, the configuration, the operations, and the effects of the embodiment are similar to those of the first embodiment described above.

The germanium oxide layer 32a and the germanium layer 32b each may be provided one layer at a time. Thereby, the cell structure of the memory device 2 can be simplified because the process of forming the germanium-and-oxygen including layer 32 can be reduced and the germanium-and-oxygen including layer 32 can be thinner.

Third Embodiment

A third embodiment will now be described.

Figure 4:
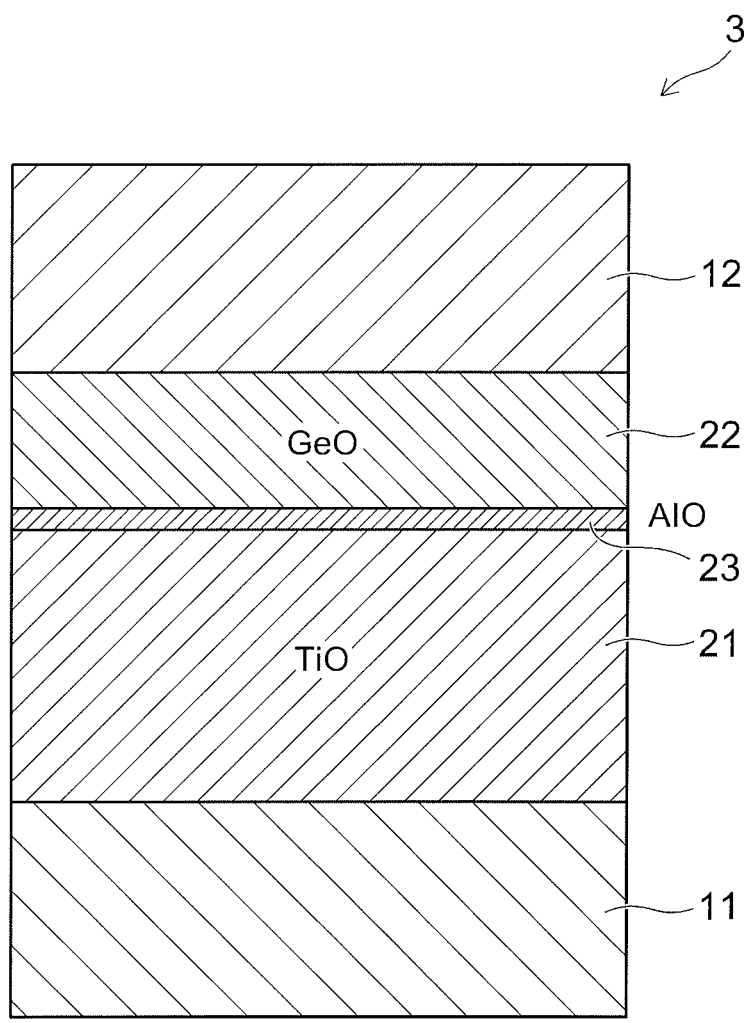
FIG. 4 is a cross-sectional view showing a memory device according to a third embodiment.

FIG. 4 is a cross-sectional view showing a memory device according to the embodiment.

As shown in FIG. 4, the memory device 3 according to the embodiment has the configuration of the memory device 1 according to the first embodiment described above (referring to FIG. 1) in which an amorphous layer 23 is provided between the crystal-including layer 21 and the germanium-and-oxygen including layer 22. The amorphous layer 23 contacts the crystal-including layer 21 and the germanium-and-oxygen including layer 22. On the other hand, in the embodiment, the germanium-and-oxygen including layer 22 is separated from the crystal-including layer 21.

The entire amorphous layer 23 is amorphous. The amorphous layer 23 includes an oxide, an oxynitride, a silicate, or an aluminate of a metal that is different from the metal included in the crystal-including layer 21 and is one or more metals selected from the group consisting of aluminum (Al), titanium (Ti), zirconium (Zr), hafnium (Hf), niobium (Nb), tantalum (Ta), and tungsten (W). The thickness of the amorphous layer 23 is, for example, 1 nm or less. In an example, the amorphous layer 23 is made from amorphous aluminum oxide (AlO); and the thickness is 0.5 nm.

In the embodiment, the movement of titanium ions due to the operations described above is suppressed by interposing the amorphous layer 23 between the crystal-including layer 21 and the germanium-and-oxygen including layer 22. Therefore, the change of the characteristics of the memory device 3 can be suppressed even when repeating the set and the reset. As a result, the durability of the memory device 3 can be improved.

Otherwise, the configuration, the operations, and the effects of the embodiment are similar to those of the first embodiment described above.

The method for forming the germanium-and-oxygen including layer 22 also is similar to that of the first embodiment.

In the embodiment as well, similarly to the second embodiment described above, the germanium-and-oxygen including layer 32 that is made of the stacked body of the germanium oxide layer 32a and the germanium layer 32b may be provided instead of the germanium-and-oxygen including layer 22.

Fourth Embodiment

A fourth embodiment will now be described.

Figure 5:
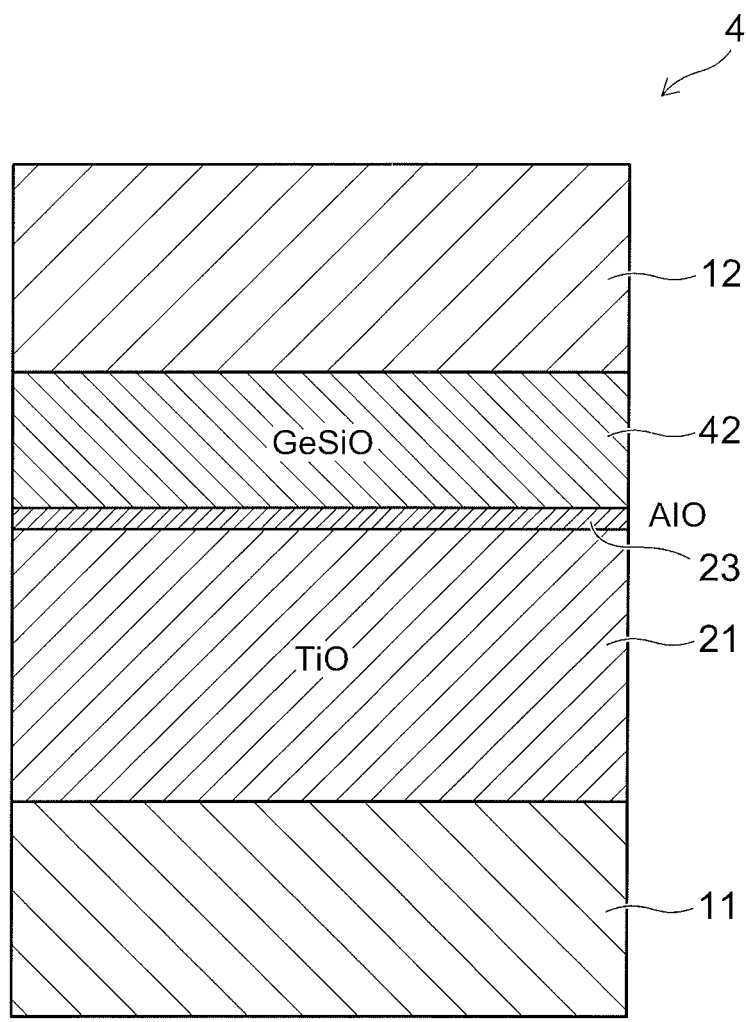
FIG. 5 is a cross-sectional view showing a memory device according to a fourth embodiment.

FIG. 5 is a cross-sectional view showing a memory device according to the embodiment.

As shown in FIG. 5, the memory device 4 according to the embodiment differs from the memory device 3 according to the third embodiment described above (referring to FIG. 4) in that a germanium-and-oxygen including layer 42 is provided instead of the germanium-and-oxygen including layer 22. In addition to germanium (Ge) and oxygen (O), the germanium-and-oxygen including layer 42 includes one or more type of Group IV element, i.e., at least one type of element selected from the group consisting of carbon (C), silicon (Si), tin (Sn), and lead (Pb). In an example, the germanium-and-oxygen including layer 42 is a single layer made of germanium silicon oxide (GeSiO).

In the embodiment, the resistance value of the germanium-and-oxygen including layer 42 can be controlled by adjusting the silicon concentration in the germanium-and-oxygen including layer 42. Also, the formation of silicon oxide inside the crystal-including layer 21 can be suppressed because the amorphous layer 23 suppresses the movement of silicon. As a result, the degradation of the operating characteristics of the memory device 4 due to repeated operations can be suppressed; and the durability can be increased.

Otherwise, the configuration, the operations, and the effects of the embodiment are similar to those of the third embodiment described above.

In the embodiment as well, similarly to the second embodiment described above, the germanium-and-oxygen including layer 32 that is made of the stacked body of the germanium oxide layer 32a and the germanium layer 32b may be provided.

First Test Example

A first test example will now be described.

Figure 6A:
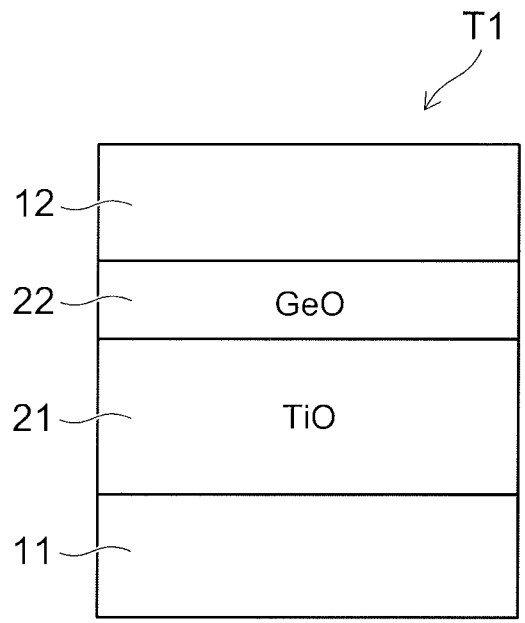
FIG. 6A is a cross-sectional view showing a sample of the first embodiment used in a first test example.
Figure 6B:
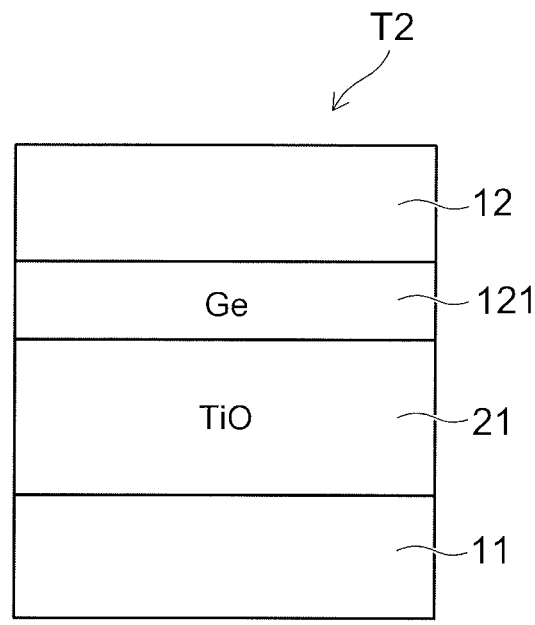
FIG. 6B is a cross-sectional view showing a sample of a comparative example.

FIG. 6A is a cross-sectional view showing a sample of the first embodiment used in the first test example; FIG. 6B is a cross-sectional view showing a sample of a comparative example; and FIG. 6C is a graph showing the I-V characteristic of each sample, in which the horizontal axis is the voltage, and the vertical axis is the current.

Figure 6C:
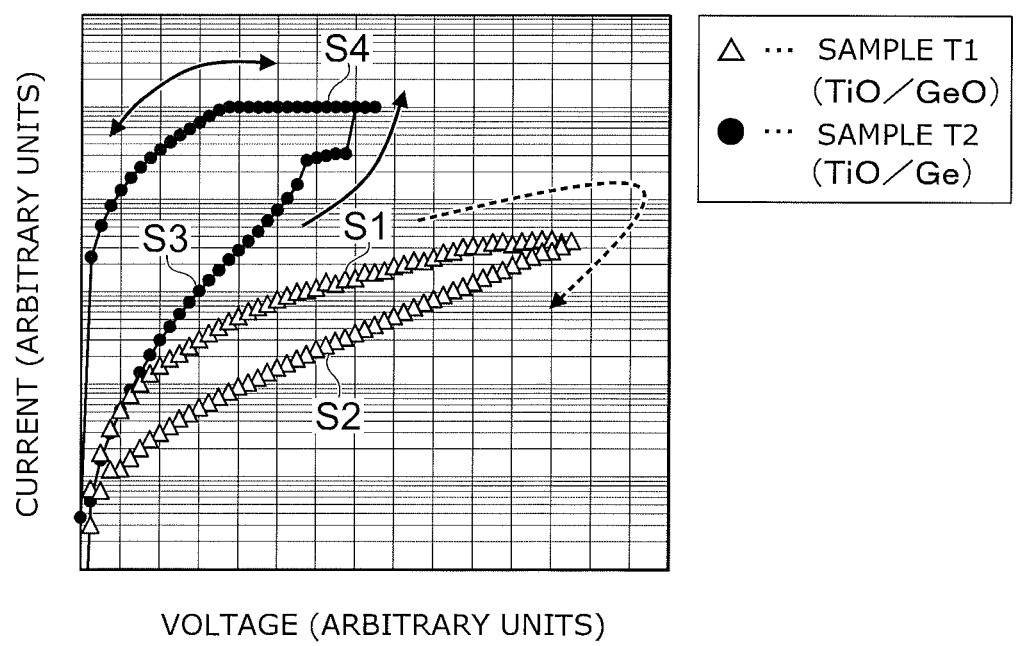
FIG. 6C is a graph showing an I-V characteristic of each sample, in which the horizontal axis is the voltage, and the vertical axis is the current.

In FIG. 6C, the horizontal axis is a linear axis; and the vertical axis is a logarithmic axis.

In the first test example as shown in FIGS. 6A and 6B, samples T1 and T2 were made as samples to be evaluated. The configuration of the sample T1 is similar to the memory device 1 according to the first embodiment (referring to FIG. 1). Namely, a TiO layer was provided as the crystal-including layer 21 between the two electrodes 11 and the electrode 12; and a GeO layer was provided as the germanium-and-oxygen including layer 22. In the configuration of the sample T2, a simple germanium layer 122 was provided instead of the germanium-and-oxygen including layer 22 in the sample T1.

As shown in FIG. 6C, the sample T1 was in a low resistance state S1 in the initial state and was reset to a high resistance state S2 when a prescribed voltage was applied. Although not illustrated, setting was performed when applying the reverse voltage; and the state transitioned from the high resistance state S2 to the low resistance state S1. Thus, in the sample T1, the low resistance state S1 and the high resistance state S2 could be switched reversibly. Therefore, the sample T1 functions as a memory device.

On the other hand, the sample T2 was in a constant resistance state S3 in the initial state; but dielectric breakdown occurred when a prescribed voltage was applied; and the state transitioned to a resistance state S4 that is lower. Thereafter, the state remained in the resistance state S4 regardless of the voltage that was applied. In other words, the transition from the resistance state S3 to the resistance state S4 was irreversible. Therefore, the sample T2 does not function as a memory device.

Second Test Example

A second test example will now be described.

In the test example, multiple samples were made in which the film thickness and the oxygen concentration of the germanium-and-oxygen including layer are mutually-different; and the characteristics of each sample were evaluated.

FIG. 7 is a table showing the effects of the film thickness and the oxygen concentration of the germanium-and-oxygen including layer on the characteristics of the sample, in which the film thickness of the germanium-and-oxygen including layer is shown in the column direction, and the oxygen concentration is shown in the row direction.

The composition of the germanium-and-oxygen including layer 22 is stable for GeO and GeO$_2$. In other words, when the composition of the germanium-and-oxygen including layer 22 is represented as GeO$_x$, the composition is stable for x of 1 or 2. Therefore, in the case where the measured value of x is greater than 1 and less than 2, it is estimated that GeO and GeO$_2$ coexist.

As shown in FIG. 7, in the case where the oxygen concentration of the germanium-and-oxygen including layer 22 was zero, i.e., in the case where the germanium-and-oxygen including layer 22 was a simple germanium layer, dielectric breakdown undesirably occurred for all of the samples; and the samples did not function as memory devices.

On the other hand, in the case where oxygen was included in the germanium-and-oxygen including layer 22, the low resistance state and the high resistance state were reversibly switchable without dielectric breakdown of the samples occurring. Therefore, these samples functioned as memory devices.

More specifically, for the samples in which the thickness of the germanium-and-oxygen including layer 22 was 2.0 nm or less and the oxygen concentration was high, the characteristics as a memory device were exceedingly good because the operating voltage was low, and the resistance change ratio, i.e., the proportion of the difference between the resistance value in the low resistance state and the resistance value in the high resistance state, was high.

When the thickness of the germanium-and-oxygen including layer 22 was thicker than 2.0 nm, the resistance of the germanium-and-oxygen including layer 22 increased; and a slightly high operating voltage was necessary. However, problems do not occur in practice if a drive circuit that can apply a high operating voltage is provided in the memory device. When the oxygen concentration of the germanium-and-oxygen including layer 22 was low, the resistance change ratio decreased slightly. It is estimated that this is because the amount of the mobile oxygen ions that can be supplied from the germanium-and-oxygen including layer 22 to the crystal-including layer 21 decreased. However, problems do not occur in practice if a high-precision read circuit is provided in the memory device.

According to the embodiments described above, a memory device can be realized in which the durability is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A memory device, comprising:
    a crystal-including layer including a first metal, at least a portion of the crystal-including layer being crystallized;
    an amorphous layer directly contacting the crystal-including layer and being made of an amorphous material including a second metal different from the first metal; and
    a germanium-and-oxygen including layer contacting the amorphous layer, being separated from the crystal-including layer, and including germanium and oxygen.

2. The device according to claim 1, wherein the amorphous layer includes an oxide, an oxynitride, a silicate, or an aluminate of the second metal.

3. The device according to claim 2, wherein the second metal is one or more metals selected from the group consisting of aluminum, titanium, zirconium, hafnium, niobium, tantalum, and tungsten.

4. The device according to claim 1, wherein the amorphous layer includes aluminum oxide.

5. The device according to claim 1, wherein the crystal-including layer includes an oxide, an oxynitride, a silicate, or an aluminate of the first metal.

6. The device according to claim 5, wherein the first metal is one or more metals selected from the group consisting of aluminum, titanium, zirconium, hafnium, niobium, tantalum, and tungsten.

7. The device according to claim 1, wherein the crystal-including layer includes crystallized titanium oxide.

8. The device according to claim 1, wherein the germanium-and-oxygen including layer is made of germanium oxide.

9. The device according to claim 1, wherein the number of oxygen atoms per germanium atom in the germanium-and-oxygen including layer is not less than 1 and not more than 2.

10. The device according to claim 1, wherein the germanium-and-oxygen including layer further includes one or more type of Group IV element.

11. The device according to claim 1, wherein
the germanium-and-oxygen including layer includes:
   a plurality of germanium oxide layers; and
   a plurality of germanium layers, and
the germanium oxide layers and the germanium layers are stacked alternately.

12. The device according to claim 1, wherein
the germanium-and-oxygen including layer includes:
   a germanium oxide layer; and
   a germanium layer, and
the germanium oxide layer is disposed between the crystal-including layer and the germanium layer.

* * * * *